United States Patent
Lo et al.

(10) Patent No.: US 7,924,591 B2
(45) Date of Patent: Apr. 12, 2011

(54) MEMORY DEVICE WITH SHIELDING PLUGS ADJACENT TO A DUMMY WORD LINE THEREOF

(75) Inventors: Chun-Yuan Lo, Hsinchu (TW); Cheng-Ming Yih, Hsinchu (TW); Wen-Pin Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 136 days.

(21) Appl. No.: 12/366,910

(22) Filed: Feb. 6, 2009

(65) Prior Publication Data

US 2010/0202179 A1   Aug. 12, 2010

(51) Int. Cl.
  *G11C 7/02*   (2006.01)
(52) U.S. Cl. ... 365/53; 365/63; 365/185.05; 365/185.25
(58) Field of Classification Search .................... 365/53, 365/63, 185.05, 185.25
See application file for complete search history.

(56) References Cited

U.S. PATENT DOCUMENTS

| 6,987,696 B1 | 1/2006 | Wang et al. |
| 2007/0166918 A1* | 7/2007 | Oh et al. ........................ 438/257 |
| 2008/0057643 A1* | 3/2008 | Aritome ........................ 438/257 |

FOREIGN PATENT DOCUMENTS

TW   200620298   6/2006

* cited by examiner

*Primary Examiner* — Hoai V Ho
(74) *Attorney, Agent, or Firm* — J.C. Patents

(57) ABSTRACT

A memory device is provided. The memory device comprises a substrate, a plurality of word lines, a plurality of conductive regions and at least a shielding plug. The substrate has a memory region and a peripheral region. The word lines are disposed on the substrate and at least a dummy word line disposed in the peripheral region and adjacent to the word lines. The conductive regions are disposed in the substrate and between the word lines respectively. The shielding plug is located on the substrate and adjacent to the dummy word line and between the dummy word line and the word lines and there is no self-aligned source region around the dummy word line.

17 Claims, 3 Drawing Sheets

MEMORY DEVICE WITH SHIELDING PLUGS ADJACENT TO A DUMMY WORD LINE THEREOF

BACKGROUND OF THE INVENTION

1. Field of Invention

The present invention relates to a semiconductor device. More particularly, the present invention relates to a memory device.

2. Description of Related Art

Non-volatile memory is currently used inside many types of electronic devices for holding structural data, programming data and other randomly access transient data. One type of non-volatile memory that can be repeatedly access is called flash memory. In fact, flash memory is an electrically erasable programmable read only memory (EEPROM) device that allows multiple data writing, reading and erasing operations. In addition, the stored data will be retained even after power to the device is removed. With these advantages, it has been broadly applied in personal computer and electronic equipment.

Conventionally, the memory device having a plurality of memory cell arranged in an array is constructed by several word lines parallel to each other. Furthermore, as shown in FIG. 3, at the boundary of the memory region where the functional word lines 302$a$ are located, at least one dummy word line 302$b$ is disposed directly aside the functional word lines 302$a$ for the purpose of increasing the exposure uniformity of the lithography process. However, the existence of the dummy word line 302$b$ aside the functional word lines 302$a$ in the memory region would lead to coupling effect between the dummy word line 302$b$ and the nearest functional word line 302$a$'. the coupling effect between the dummy word line 302$b$ and the nearest functional word line 302$a$' leads to differentiating the performance of the nearest functional word line 302$a$' from the performance of other functional word lines 302$a$ in the memory region. Therefore, the performances of the memory cells in the memory are not equivalent.

SUMMARY OF THE INVENTION

Accordingly, at least one objective of the present invention is to provide a memory device structure capable of decreasing the coupling effect between the dummy word line and the word line.

At least another objective of the present invention is to provide a memory device structure capable of overcoming the leakage during the program operation and the read operation.

To achieve these and other advantages and in accordance with the purpose of the invention, as embodied and broadly described herein, the invention provides a memory device on a substrate. The memory device comprises a plurality of word lines, at least one dummy word line, a plurality of self-aligned source regions, a plurality of drain regions and at least a shielding plug. The word lines and the dummy word line are disposed on the substrate. The word lines are parallel to each other. Also, the dummy word line is disposed at a periphery of the plurality of the word lines and the dummy word line is parallel to the plurality of the functional word lines. The self-aligned source regions and the drain regions are disposed in the substrate and alternatively arranged between the functional word lines respectively. It should be noticed that none of the self-aligned source regions is arranged directly around the dummy word line. Noticeably, only one side of the dummy word line is arranged with the drain region. Furthermore, the shielding plug is disposed directly adjacent to the dummy word line and between the dummy word line and the plurality of the word lines. Moreover, the shielding plug is electrically coupled to the drain region located in the substrate and between the dummy word line and the plurality of the word lines.

The invention also provides a memory device. The memory device comprises a plurality of memory cells, a plurality of word lines, a dummy word line and a plurality of shielding plugs. The word lines connect to the memory cells. The dummy word line is disposed adjacent to the plurality of word lines. The shielding plugs are distributed between the dummy word line and the plurality of word lines.

In the present invention, since the space between the dummy word line/dummy gate structure and the nearest functional word line/stacked gate structure is enlarged and the shielding plug can be a metal shielding to isolate the nearest functional word line from being voltage coupling with the dummy word line, the coupling effect between the dummy word line/dummy gate structure and the nearest functional word line/stacked gate structure is decrease Therefore, the erase threshold voltage distribution of the memory cells in the memory device is tighten without being affected by the dummy word line. Furthermore, because there is no common source region/self-aligned source region around the dummy word line, the leakage problem during the read operation and the program operation can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
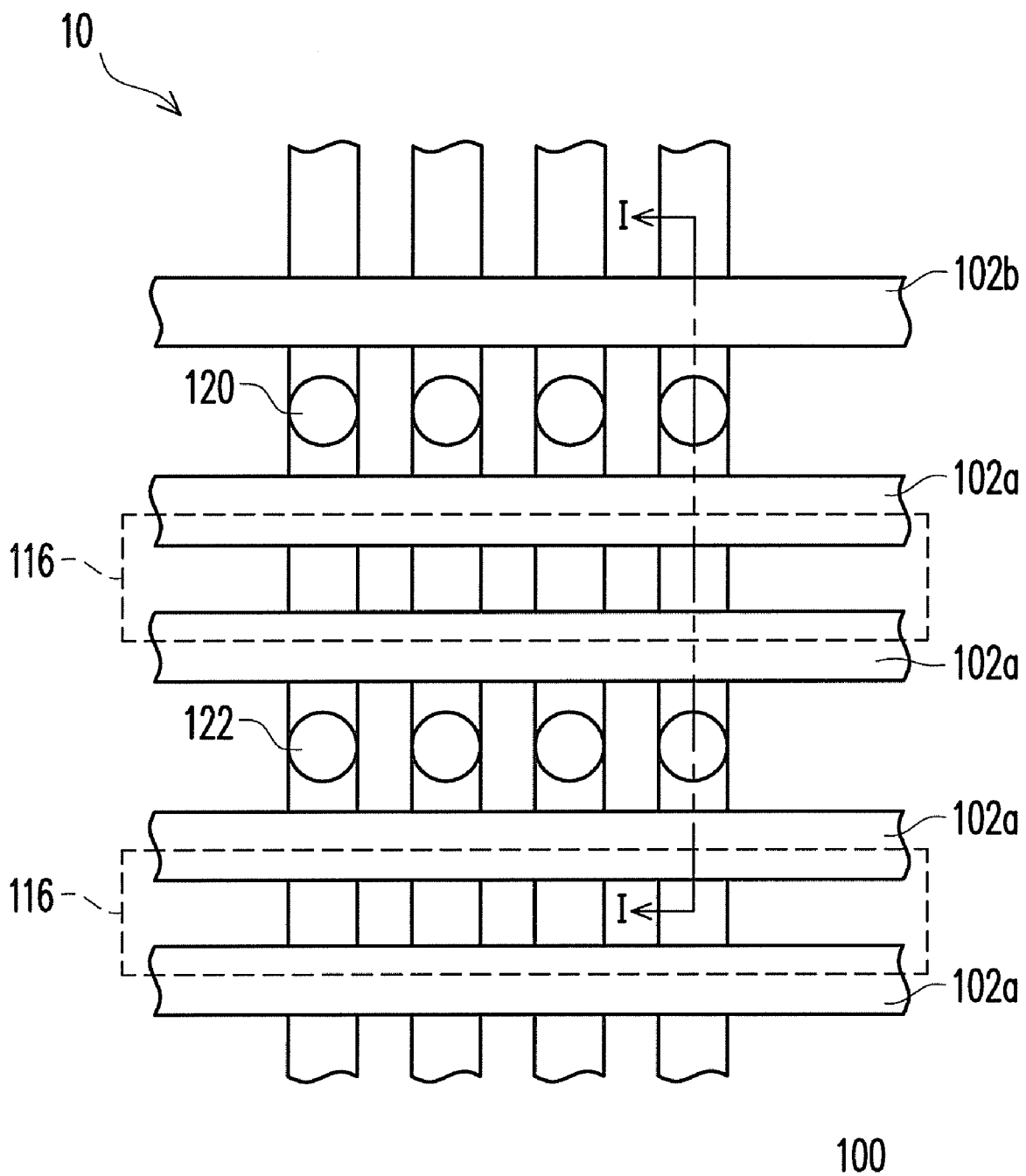
FIG. 1 is a top view showing a memory device according to a one embodiment of the invention.
Figure 2:
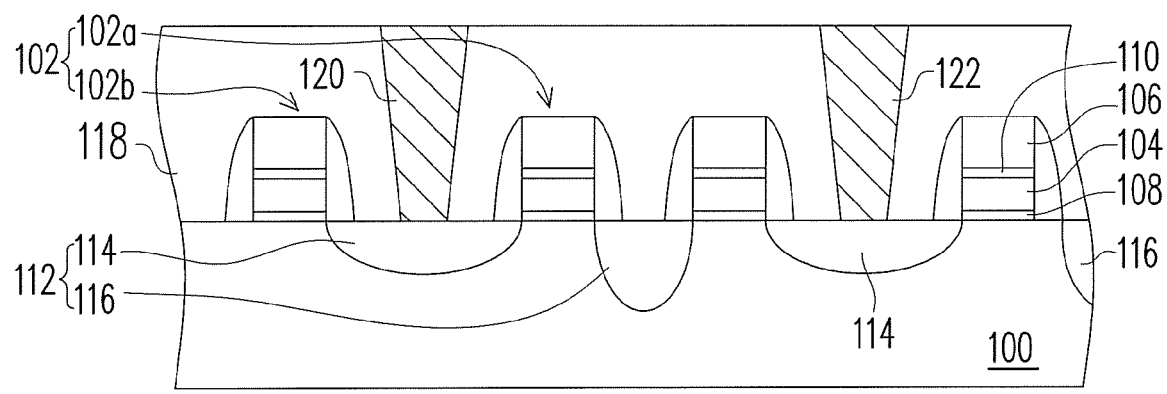
FIG. 2 is a cross-sectional view along line I-I in FIG. 1.
Figure 3:
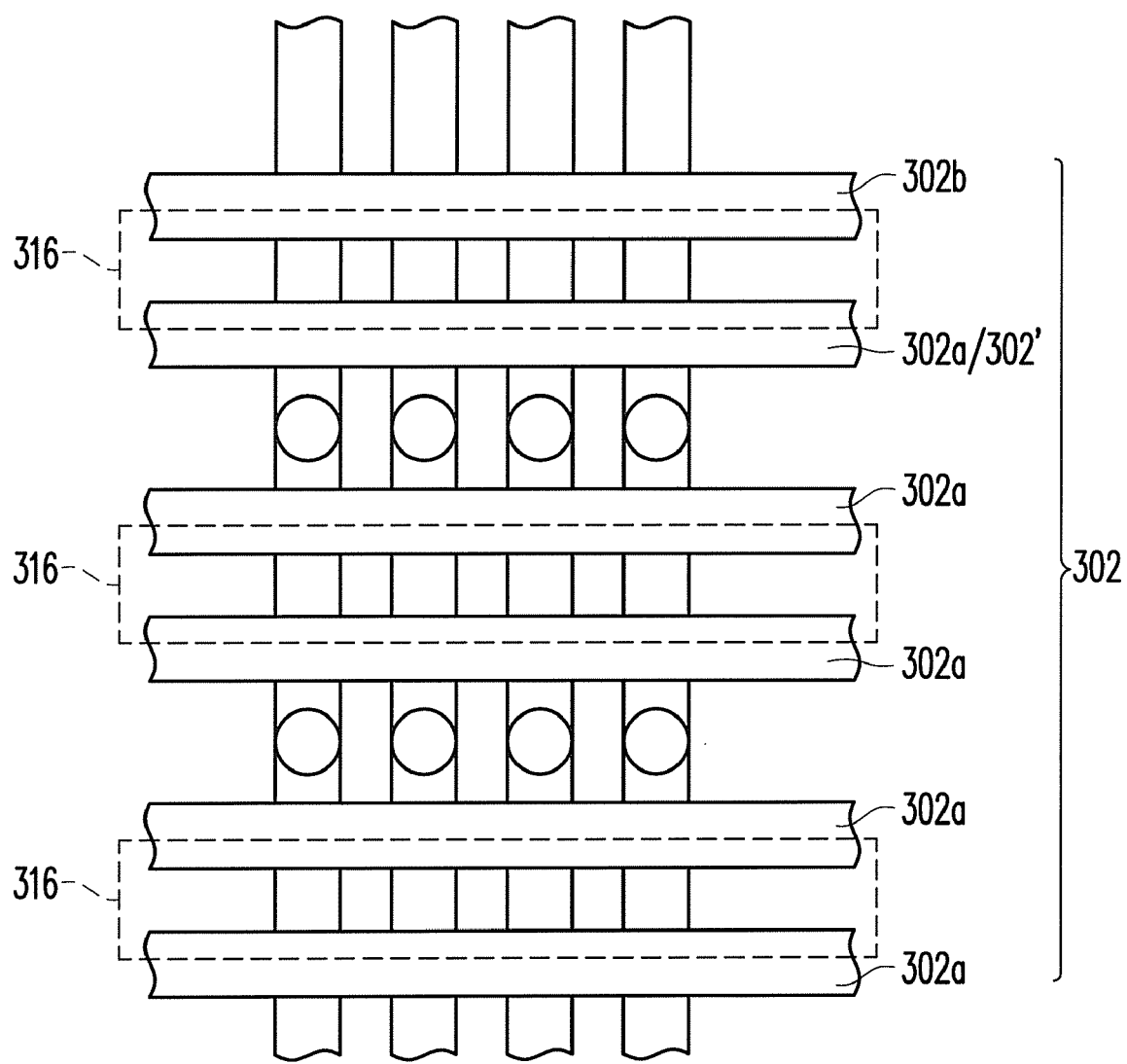
FIG. 3 is a top view showing a conventional memory device.

FIG. 1 is a top view showing a memory device according to a one embodiment of the invention. FIG. 2 is a cross-sectional view along line I-I in FIG. 1. As shown in FIG. 1 and FIG. 2, a memory device 10 is provided. In the memory device 10, a plurality of memory cells are arranged as an array. The memory cell can be, for example but not limited to, a multi-level cell for storing multiple bit data. The memory device 10 mainly comprises a substrate 100. The substrate 100 can be, for example but not limited to, a silicon substrate with a first conductive type. Alternatively, the substrate 100 can be a substrate with a shallow well (not shown) having the first conductive type. Moreover, a plurality of conductive lines 102$a$ disposed on the substrate 100 and the conductive lines 102$a$ are parallel to each other. The conductive lines 102$a$ can be, for example but not limited to, word lines. It should be noticed that there are at least one semidetached conductive line 102$b$ disposed aside the conductive lines 102$a$. Also, the semidetached conductive line 102$b$ is disposed at a periphery of the group of the conductive lines 102$a$. On the other words, the semidetached conductive line 102$b$ is directly adjacent to the outmost conductive line of the plurality of the conductive lines 102*a*. The semidetached conductive line 102*b* can be, for example but not limited to, dummy word line. Furthermore, the conductive lines 102*a* electrically couple to the memory cells respectively.

Moreover, each of the conductive lines 102*a* comprises a data storage element. The data storage element mentioned above can be, for example but not limited to, a floating gate or a charge trapping dielectric layer. In one embodiment, as shown in FIG. 2, each of the conductive lines 102*a* can be, for example but not limited to, a stacked gate structure having a floating gate 104 and a control gate 106 located over the floating gate 104. Also, the semidetached conductive line 102*b* can be formed together with the conductive lines 102*a*. Accordingly, the semidetached conductive line 102*b*/dummy gate structure can be, for example, the stacked gate structure as same as the conductive lines 102*a*. Further, the floating gate 104 is isolated from the substrate 100 by a tunneling dielectric layer 108 and is further isolated from the control gate 106 by an inter-gate dielectric layer 110. The tunneling dielectric layer 108 can be, for example but not limited to, made from silicon oxide by thermal oxidation. Also, the inter-gate dielectric layer 110 can be, for example but not limited to, an oxide/nitride/oxide composite layer, an oxide/nitride composite layer or a silicon oxide layer formed, for example, by carrying out a low-pressure chemical vapor deposition (LPCVD). Moreover, the floating gate 104 and the control gate 106 can be, for example but not limited to, made from doped polysilicon by carrying out a chemical vapor deposition to form an undoped polysilicon layer and implanting ions into the undoped polysilicon layer. Alternatively, the floating gate 104 and the control gate 106 can be fabricated in an in-situ ion doping and chemical vapor deposition process.

As shown in FIG. 2, a plurality of conductive regions 112 are disposed in the substrate and between the conductive lines 102*a* respectively and between the semidetached conductive line 102*b* and the plurality of the conductive lines 102*a*. Notably, the conductive regions 112 can be diffusion regions including several drain regions 114 and several source region 116. Also, the drain regions 114 and the source regions 116 are alternatively arranged between the conductive lines 102. In addition, only one side of the semidetached conductive line 102*b* in the substrate 100 and between the semidetached conductive line 102*b* and the plurality of the conductive lines 102*a* is arranged with one of the conductive regions 112, which can be the drain region 114. Moreover, the conductive regions 112 can be, for example, formed by implanting process. More specifically, the source regions 116 can be, for example, self-aligned source regions. Additionally, the conductive regions 112 have a second conductive type. The first conductive type is different from the second conductive type. It should be noticed that none of the self-aligned source regions 116 is arranged directly around the semidetached conductive line 102*b*.

As shown in FIG. 2, an inter-layer dielectric layer 118 is formed to cover the conductive lines 102*a*, the semidetached conductive line 102*b* and the substrate 100. The inter-layer dielectric layer 118 is fabricated using borophosphosilicate glass (BPSG) or phosphosilicate glass (PSG) in a chemical vapor deposition, for example. The inter-layer dielectric layer 118 can further be, for example, planarized by back etching or performing a chemical-mechanical polishing process. Further, at least one shielding plug 120 penetrates through the inter-layer dielectric layer 118 and is located on the substrate 100. It should be noticed that the shielding plug 120 is immediately adjacent to the semidetached conductive line 102*b* and is located between the semidetached conductive line 102*b* and the plurality of conductive lines 102*a*. Moreover, the shielding plug 120 is electrically connected to the conductive region 114 located between the semidetached conductive line 102*b* and the group of the conductive lines 102*a*. Also, the shielding plug 120 can be, for example but not limited to, made of conductive material such as tungsten. In addition, there are several contact plugs 122 located within the inter-layer dielectric layer 118 and electrically connected to the drain regions 114 between the conductive lines 102*a* respectively. For example but not limited to, the shielding plug 120 can be formed together with the contact plugs 122 in inter-layer dielectric layer 118 at the same manufacturing step.

In the present invention, since the semidetached conductive line 102*b*/dummy gate structure is pull away from the nearest conductive line 102*a* by a shielding plug 120, the space between the semidetached conductive line 102*b* and the nearest conductive line 102*a* is enlarged. Furthermore, the shielding plug 120 can be a metal shielding to isolate the nearest conductive line 102*a* from being voltage coupling with the semidetached conductive line 102*b*. Accordingly, the operation environments of the conductive lines are similar to each other and the performances of the conductive lines are more equivalent.

Additionally, no self-aligned source region is disposed directly around the semidetached conductive line 102*b*. As shown in FIG. 1, it is clear that the semidetached conductive line 102*b* is separated from the nearest conductive line 102*a* by the shielding plug 120 and there is no self-aligned source regions 116 directly around semidetached conductive line 102*b*, Accordingly, the coupling effect between the gate in the semidetached conductive line 102*b* and the gate in the nearest conductive line 102*a* is decreased. Therefore, the erase threshold voltage of the conductive line close to the semidetached conductive line would not be affected by the coupling effect. Thus, the erase threshold voltage distribution of the memory cells in the memory device will be tighten.

Furthermore, because there is no source region, such as self-aligned source region, directly around the semidetached conductive line 102*b*, no current from self-aligned source region would leak through the semidetached conductive line 102*b*. Thus, the leakage problem during the read operation and the program operation of the memory device can be overcome. Therefore, the programming ability of the memory device is enhanced. Moreover, since the leakage of the memory cells in the memory devices is suppressed and the erase threshold voltage distribution is tighten, the read judgment window is enlarged.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A memory array, comprising:
   a plurality of memory cells;
   a plurality of word lines, each word line being connected to a plurality of gates of the memory cells;
   a dummy word line disposed in an area outside of an outmost word line of the plurality of word lines; and
   a plurality of shielding plugs immediately adjacent to the dummy word line and located between the dummy word line and the outmost word line,
   wherein no conductive region is disposed directly around the dummy word line.

2. The memory array of claim 1 further comprising a plurality of conductive regions disposed between the word lines respectively and between the dummy word line and the plurality of the word lines.

3. The memory array of claim 2, wherein only one side of the dummy word line which is between the dummy word line and the plurality of the word lines is arranged with the conductive region.

4. The memory array of claim 2, wherein the conductive regions comprise a plurality of drain regions and a plurality of source regions and the drain regions and the source regions are alternatively arranged in the memory region between the word lines.

5. The memory array of claim 4 further comprising a plurality of contact plugs located on the drain regions and electrically connected to the drain regions between the word lines respectively.

6. A memory device, comprising:
a plurality of memory cells;
a plurality of word lines, each word lines being connected to a plurality of gats of the plurality of the memory cells;
a dummy word line being immediately adjacent to an outmost word line of the plurality of word lines;
a first region located between the dummy word line and the outmost word line and a second region located between outmost two word lines of the plurality of word lines, wherein the first region is border than the second region; and
a plurality of shielding plugs distributed in the border region,
wherein no conductive region is disposed one side of the dummy word line far from the outmost word line.

7. The memory device of claim 6 further comprising a plurality of conductive regions disposed between the word lines respectively and between the dummy word line and the plurality of the word lines.

8. The memory device of claim 7, wherein only one side of the dummy word line which is between the dummy word line and the plurality of the word lines is arranged with the conductive region.

9. The memory device of claim 7, wherein the conductive regions comprise a plurality of drain regions and a plurality of source regions and the drain regions and the source regions are alternatively arranged in the memory region between the word lines.

10. The memory device of claim 9, wherein the conductive region in the substrate between the dummy word line and the plurality of the word lines is one of the drain regions.

11. The memory device of claim 9 further comprising a plurality of contact plugs located on the drain regions and electrically connected to the drain regions between the word lines respectively.

12. A memory device, comprising:
a plurality of memory cells;
a plurality of conductive lines, each conductive line being connected to a plurality of gates of the memory cells;
a semidetached conductive line substantially parallel to and directly adjacent to an outmost conductive lines, wherein no conductive region is disposed one side of the dummy word line far from the outmost word line; and
a plurality of shielding plugs disposed between the plurality of conductive line and the semidetached conductive line, wherein the plurality of shielding plugs distributed along the semidetached conductive line.

13. The memory device of claim 12 further comprising a plurality of conductive regions disposed between the conductive lines respectively and between the semidetached conductive line and the plurality of the conductive lines.

14. The memory device of claim 13, wherein only one side of the semidetached conductive line which is between the semidetached conductive line and the plurality of the conductive lines is arranged with the conductive region.

15. The memory device of claim 13, wherein the conductive regions comprise a plurality of drain regions and a plurality of source regions and the drain regions and the source regions are alternatively arranged in the memory region between the conductive lines.

16. The memory device of claim 15, wherein the conductive region in the substrate between the semidetached conductive line and the plurality of the conductive lines is one of the drain regions.

17. The memory device of claim 15 further comprising a plurality of contact plugs located on the drain regions and electrically connected to the drain regions between the conductive lines respectively.

* * * * *